US009385675B2

(12) United States Patent
Liu et al.

(10) Patent No.: US 9,385,675 B2
(45) Date of Patent: Jul. 5, 2016

(54) POWER AMPLIFIER CIRCUIT CAPABLE OF ADJUSTING GAIN DYNAMICALLY

(71) Applicant: AIROHA TECHNOOGY CORP., Hsinchu (TW)

(72) Inventors: Yu-Hua Liu, Hsinchu (TW); Ting-Yao Huang, Hsinchu (TW); John-San Yang, Hsinchu (TW)

(73) Assignee: Airoha Technology Corp., Hsinchu (TW)

(*) Notice: Subject to any disclaimer, the term of this patent is extended or adjusted under 35 U.S.C. 154(b) by 245 days.

(21) Appl. No.: 14/279,697

(22) Filed: May 16, 2014

(65) Prior Publication Data

US 2015/0288338 A1 Oct. 8, 2015

(30) Foreign Application Priority Data

Apr. 3, 2014 (TW) ............................ 103112432 A

(51) Int. Cl.

| | |
|---|---|
| ***H03F 3/45*** | (2006.01) |
| ***H03G 3/00*** | (2006.01) |
| ***H03F 3/193*** | (2006.01) |
| ***H03F 3/24*** | (2006.01) |
| ***H03F 1/02*** | (2006.01) |
| ***H03F 1/22*** | (2006.01) |

(52) U.S. Cl.

CPC ............. *H03G 3/007* (2013.01); *H03F 1/0266* (2013.01); *H03F 1/223* (2013.01); *H03F 3/193* (2013.01); *H03F 3/245* (2013.01); *H03F 3/45179* (2013.01); *H03F 3/45183* (2013.01); *H03F 3/45475* (2013.01); *H03F 2200/102* (2013.01); *H03F 2200/105* (2013.01); *H03F 2200/211* (2013.01); *H03F 2200/451* (2013.01); *H03F 2200/465* (2013.01); *H03F 2200/555* (2013.01); *H03F 2203/45112* (2013.01); *H03F 2203/45594* (2013.01); *H03F 2203/45596* (2013.01); *H03F 2203/45631* (2013.01); *H03F 2203/45702* (2013.01)

(58) Field of Classification Search

CPC ........................................................ H03F 3/45

See application file for complete search history.

(56) References Cited

U.S. PATENT DOCUMENTS

| | | | | |
|---|---|---|---|---|
| 5,942,946 | A * | 8/1999 | Su | H03F 1/0244 330/285 |
| 6,784,740 | B1 | 8/2004 | Tabatabaei | |
| 6,972,629 | B2 | 12/2005 | Behzad | |
| 7,622,992 | B2 | 11/2009 | Liu | |

OTHER PUBLICATIONS

Masoud Zargari, Manolis Terrovitis, Steve Hung-Min Jen, Brian J. Kaczynski, Meelan Lee, Michael P. Mack, Srenik S. Mehta, Sunetra Mendis, Keith Onodera, Hirad Samavati, William W. Si, Kalwant Singh, Ali Tabatabaei, David Weber, David K. Su, and Bruce A. Wooley; A Single-Chip Dual-Band Tri-Mode CMOS Transceiver for IEEE 802.11 a/b/g Wireless LAN, IEEE Journal of Solid-State Circuits, vol. 39, No. 12, Dec. 2004, pp. 2239-2249.

* cited by examiner

*Primary Examiner* — Hai L Nguyen

(74) *Attorney, Agent, or Firm* — Rosenberg, Klein & Lee

(57) ABSTRACT

The invention provides a power amplifier circuit capable of adjusting gain dynamically. The power amplifier circuit comprises a power supply unit configured to provide a power supply signal; an input power detection unit for receiving at least one input signal and the power supply signal, detecting the power of the input signal to generate a detection signal, and pulling up or down a bias signal by the detection signal; a power amplifier unit for receiving the input signal and the bias signal, adjusting the gain by the controlling of the bias signal, and amplifying the input signal by the adjusted gain to output at least one output signal. Therefore, the gain of power amplifier circuit will be adjusted dynamically by detecting the power of the input signal, so that the output signal conforming to the actual power may be outputted.

13 Claims, 8 Drawing Sheets

POWER AMPLIFIER CIRCUIT CAPABLE OF ADJUSTING GAIN DYNAMICALLY

FIELD OF THE INVENTION

The present invention is related to a power amplifier circuit, particularly to a power amplifier circuit capable of adjusting gain capable of adjusting gain dynamically.

BACKGROUND

Power amplifier circuits are widely used in the field of wireless communications. Many wireless communication systems use power amplifier circuits to amplify the signal before it is transmitted, so that the power or the amplitude of the signal may be amplified to a desired value.

Referring to FIG. 1, there is shown a circuit diagram of a conventional power amplifier circuit. As shown in figure, the power amplifier circuit 100 comprises a power amplifier unit 11, a power detection unit 13, and a bias control unit 15.

The input terminal of the power amplifier 11 is connected to an input signal $f_{in}$ via a first capacitor 121. The power detection unit 13 comprises an N-type transistor 131, the gate terminal of which is connected to the input signal $f_{in}$ via a second capacitor 122. The first capacitor 121 and the second capacitor 122 are used for eliminating the DC voltage component of the input signal $f_{in}$, such that the power amplifier 11 and the power detection unit 13 will only receive the AC voltage component of the input signal $f_{in}$. The bias control unit 15 comprises a current mirror that consists of two P-type transistors 151, 152, a diode connected N-type transistor 153, and an inductor 154.

The power detection unit 13 receives the input signal $f_{in}$ via the gate terminal of the transistor 131, and generates a half-wave current signal on the drain terminal of the transistor 131 by detecting the power of the input signal $f_{in}$. Then, current mirror consisted of two P-type transistors 151, 152 couples the half-wave current signal to the N-type transistor 153. The inductor 154 generates a bias 111 to the input terminal of the power amplifier circuit 11 according to the half-wave current signal. When the power of the input signal $f_{in}$ is larger, the bias 111 will be pulled up, consequently resulting the power amplifier circuit 11 may be flow more current $I_{OUT}$ and increase the gain. On the contrary, when the power of the input signal $f_{in}$ is smaller, the bias 111 will be pulled down, consequently resulting the power amplifier circuit 11 may be flow less current $I_{OUT}$ and decrease the gain. Therefore, the gain of the power amplifier circuit 100 may be adjusted dynamically by detecting the power magnitude of the differential input signal $f_{in}$.

Referring to FIG. 2, there is shown a circuit diagram of another conventional power amplifier circuit. As shown in figure, the power amplifier circuit 200 comprises a power amplifier unit 21 and a peak detection feedback unit 23.

The power amplifier unit 21 comprises a load resistor 211 and two transistors 213, 215. The load resistor 211 is connected between the voltage source $V_{DD}$ and the output terminal 203 of the power amplifier circuit 200. Two transistors 213, 215 are coupled in a cascade configuration, where the gate terminal of the transistor 215 is connected to the input terminal 201 of the power amplifier circuit 200 to receive an input signal (in). Two transistors 213, 215 are used to amplify the input signal to generate an output signal (out) at the drain terminal of transistor 213.

The peak detection feedback unit 23 comprises a first peak detector 231, a second peak detector 233, an attenuator 235, and a differential amplifier 237. The input signal is transmitted to the first peak detector 231, and then the first peak detector 231 is for detecting the power of the input signal to generate a first detection signal. The first detection signal will be transmitted to the positive terminal of differential amplifier 237. The output signal is transmitted to attenuator 235 that attenuates the output signal by a factor proportional. For example, the power amplifier unit 21 has a gain of A, and then the attenuator 235 attenuates the gain of the output signal to 1/A. The attenuated output signal is transmitted to the second peak detector 233, and then the second peak detector 233 for detecting the power of the attenuated output signal to generate a second detection signal that is transmitted to the negative of the differential amplifier 237.

The differential amplifier 237 compares the different between the first detection signal and the second detection signal to output a bias 210. The bias 210 is transmitted to the gate terminal of the transistor 215 to adjust the gain of the power amplifier unit 21.

If the power of the input signal is greater than the power of the attenuated output signal, it indicates that the gain of the power amplifier unit 21 is less than the required gain, which result would allow the differential amplifier 237 to generate a higher bias 210 that is transmitted to the gate of transistor 215. Whereby the controlling of the higher bias 210, more current flows through the power amplifier unit 21 and the gain of the power amplifier unit 21 is increased.

Oppositely, if the power of the input signal is less than the power of the attenuated output signal, it indicates that the gain of the power amplifier unit 21 is greater than the required gain, which result would allow the differential amplifier 237 to generate a lower bias 210 that is transmitted to the gate of transistor 215. Whereby the controlling of the lower bias 210, less current flows through the power amplifier unit 21 and the gain of the power amplifier unit 21 is reduced.

Accordingly, different from the traditional power amplifier circuit 100, 200, the present invention provides an innovative architecture for power amplifier circuit that not only may adjust the gain dynamically and but also can maintain the linearity of gain better, it will be the objects to be achieved by the present invention desirably.

SUMMARY OF THE INVENTION

It is one object of the present invention to provide a power amplifier circuit, in which may be used for receiving a input signal or a differential pair of input signals, and then detecting the power of the input signal or the differential pair of input signals to adjust the gain dynamically so as to generate an output signal or a differential pair of output signals conforming to actual power desirably, in such a way that not only can reduce the power consumption of the circuit, but can also maintain the linearity of gain better.

It is one object of the present invention to provide a power amplifier circuit, whose circuit architecture is consisted of a translinear loop, such that the bias of power amplifier circuit may be avoided changing in non-linear, and therefore the stability in the gain adjustment is increased.

It is one object of the present invention to provide a power amplifier circuit, wherein the gain of the power amplifier circuit is before adjusting, the input signals will be deferrable transmitted to the internal of the power amplifier circuit so as to avoid the power amplifier circuit adopting the unadjusted gain to amplify the input signals.

It is one object of the present invention to provide a power amplifier circuit, the bias of which is adjusted by two detection signals generated at different time, in such a way that the power amplifier circuit can always obtain the sufficient output current so as to maintain the gain of circuit to be in the high-level.

It is one object of the present invention to provide a power amplifier circuit, the bias of which is adjusted by a detection signal obtained in the earlier time and another detection signal obtained in later time together, which is able to prolong the operation time of amplification process of the power amplifier circuit.

To achieve above objects, the present invention provides a power amplifier circuit, comprising: a power supply unit, used for providing a power supply signal; an input power detection unit, comprising at least one first transistor that is having the first terminal connected to a power supply voltage, the second terminal with a first current, and the control terminal for receiving at least one input signal via a first capacitor and connected to the power supply unit, wherein the input power detection unit is used for detecting the power of the input signal to generate a first detection signal at the second terminal of the first transistor, in which a bias signal is pulled up or down by means of the detection signal; and a power amplifier unit, comprising at least one second transistor that is having the first terminal connected to the power supply voltage and for outputting at least one output signal, the second terminal connected to ground, and the control terminal for receiving the input signal via a second capacitor, wherein the bias signal is transmitted to the control terminal of the second transistor so as to adjust the gain of the power amplifier unit.

In one embodiment of the present invention, wherein the second terminal of the first transistor is further connected with a capacitor unit.

In one embodiment of the present invention, wherein the control terminal of the first transistor is connected to the power supply unit via a first load element that be resistor or inductor.

In one embodiment of the present invention, wherein the power supply unit comprises at least two power supply transistors connected in the form of diode and coupled in a cascade configuration, the first terminal and the second terminal of the power supply transistor cascaded in the uppermost position is connected to the control terminal of the first transistor via the first load element.

In one embodiment of the present invention, wherein the power supply unit comprises a power supply transistor that is having the first terminal connected to the control terminal of the first transistor via the first load element, the second terminal connected to ground, and the control terminal connected to the second terminal of the first transistor and connected to ground via a load unit.

In one embodiment of the present invention, wherein the control terminal of the second transistor is connected to the second terminal of the second transistor via a second load element that be resistor or inductor.

In one embodiment of the present invention, wherein the first terminal of the second transistor is connected to the power supply voltage via a third load element that be resistor or inductor.

In one embodiment of the present invention, wherein the number of the first transistor is two, the two first transistors will form as a differential pair of first transistors, the number of the second transistor is two, the two second transistors will form as a differential pair of second transistors; wherein the control terminals of the differential pair of first transistors and the differential pair of second transistors are for receiving two input signals that are a differential pair of input signals, while the first terminals of the differential pair of second transistors are for outputting two output signals that are a differential pair of input signals.

In one embodiment of the present invention, further comprising a first delay amplifier, wherein the power amplifier unit receives the input signal via the first delay amplifier, the first delay amplifier defines a signal delay transmission time that is greater than or equal to a required operation time in a power detection process executed by the input power detection unit, wherein the input signal will be transmitted to the input power detection unit and the first delay amplifier, respectively; thereafter, the first delay amplifier will be allowed to transmit the input signal to the power amplifier unit after waiting the signal delay transmission time.

In one embodiment of the present invention, further comprising a first delay amplifier and a second delay amplifier, wherein the power amplifier unit receives the input signal via the first delay amplifier and the input power detection unit receives the input signal via the second delay amplifier, the first delay amplifier defines a signal delay transmission time and the second delay amplifier defines another signal delay transmission time, the signal delay transmission time defined by the first delay amplifier is greater than or equal to the sum of the another signal delay transmission time defined by the second delay amplifier and a required operation time in a power detection process executed by the input power detection unit, wherein the input signal will be transmitted to the first delay amplifier and the second delay amplifier, respectively; thereafter, the second delay amplifier will be allowed to transmit the input signal to the input power detection unit after waiting another signal delay transmission time defined by the second delay amplifier, while the first delay amplifier will be allowed to transmit the input signal to the power amplifier unit after waiting the signal delay transmission time defined by the first delay amplifier.

In one embodiment of the present invention, further comprises an output power detection unit, the output power detection unit comprises at least one third transistor that is having the first terminal connected to the power supply voltage, the second terminal with a second current and connected to the second terminal of the first transistor, and the control terminal connected to the first terminal of the second transistor via a third capacitor to receive the output signal, wherein the output power detection unit is used for detecting the power of the output signal to generate a second detection signal at the second terminal of the third transistor, in such a way that the bias signal may be pull up or down by means of the first detection signal and the second detection signal together.

In one embodiment of the present invention, wherein the number of the first transistor is two, the two first transistors will form as a differential pair of first transistors, the number of the second transistor is two, the two second transistors will form as a differential pair of second transistors, the number of the third transistor is two, the two third transistors form as a differential pair of third transistors; wherein the control terminals of the differential pair of first transistors and the differential pair of second transistors are for receiving two input signals that are a differential pair of input signals, the first terminals of the differential pair of second transistors are for outputting two output signals that are a differential pair of input signals, while the control terminals of the differential pair of third transistors are for receiving the differential pair of output signals.

In one embodiment of the present invention, wherein the control terminals of the differential pair of third transistors are connected together via a fourth load element that be resistor or inductor.

DETAILED DESCRIPTION

Figure 1:
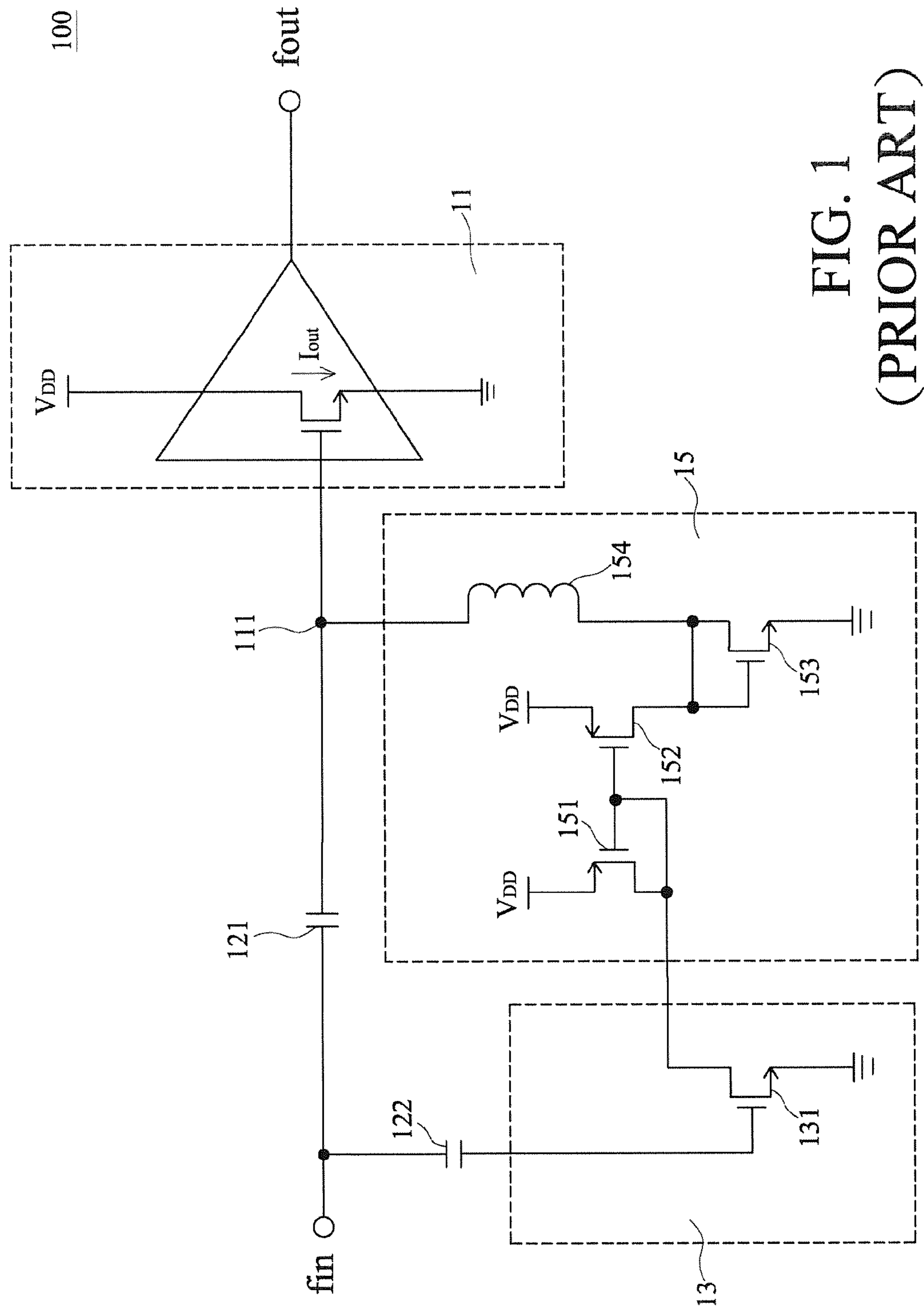
FIG. 1 is a circuit diagram of a conventional power amplifier circuit.
Figure 2:
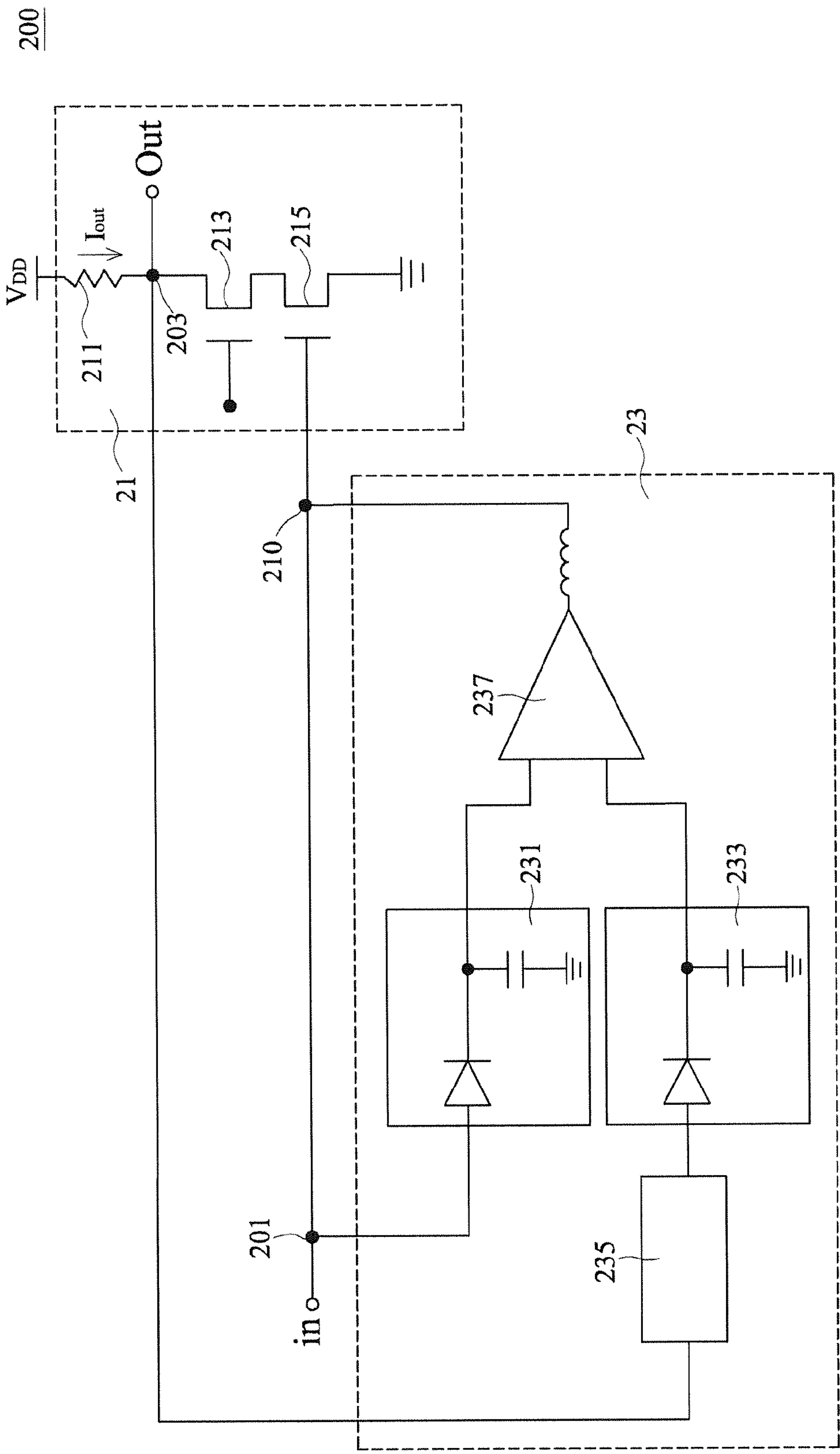
FIG. 2 is a circuit diagram of another conventional power amplifier circuit.
Figure 3:
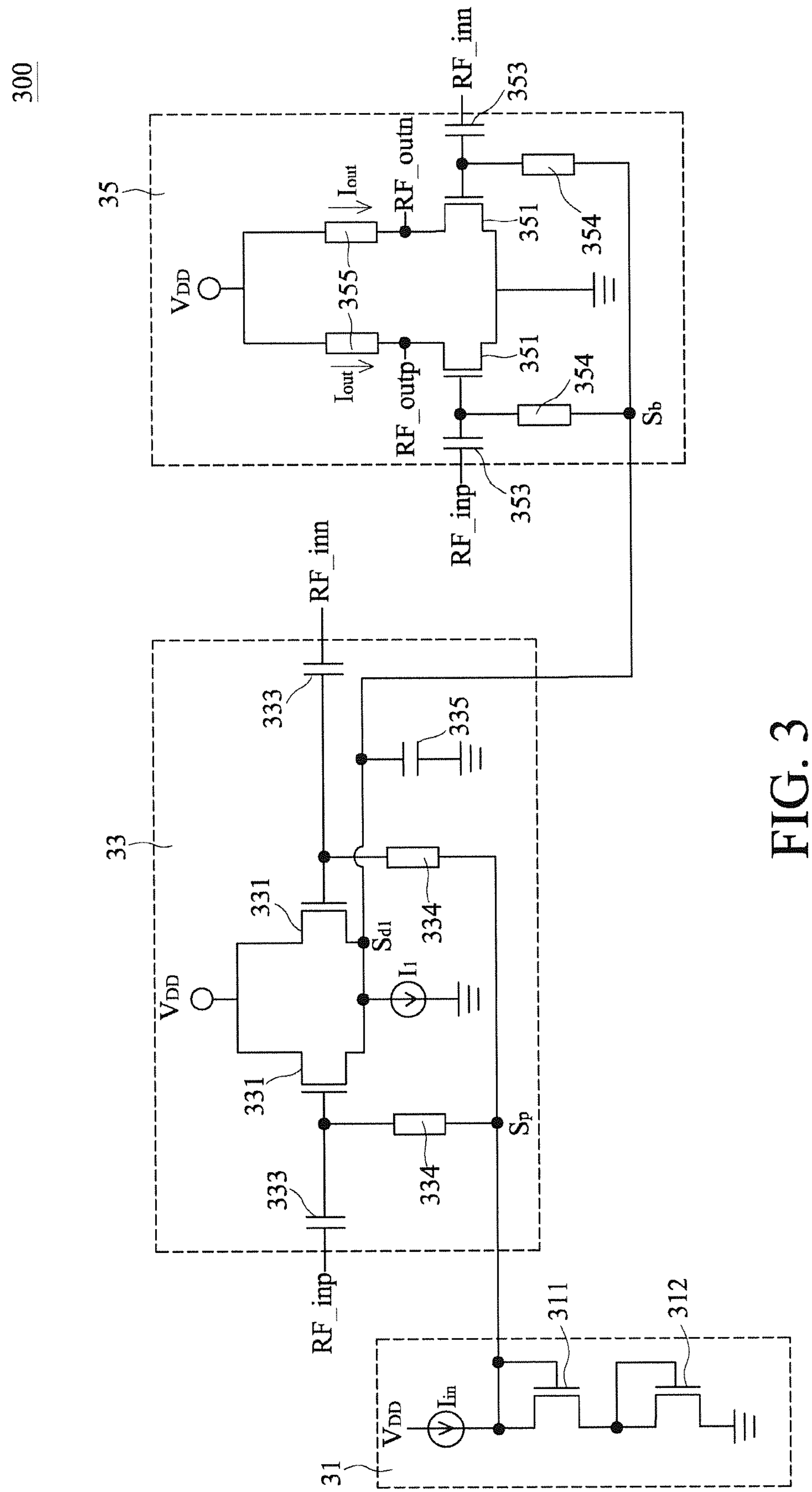
FIG. 3 is a circuit diagram of a power amplifier circuit according to one embodiment of the present invention.

Referring to FIG. 3, there is shown a circuit diagram of a power amplifier circuit according to one embodiment of the present invention. As shown in figure, the power amplifier circuit 300 of the present invention is a RF power amplifier circuit, which comprises a power supply unit 31, an input power detection unit 33 and a power amplifier unit 35.

The power supply unit 31 comprises at least two power supply transistors 311, 312 connected in the form of diode. The power supply transistors 311, 312 are coupled in a cascade configuration and for providing a stable power supply signal $S_P$.

The input power detection unit 33 is an envelope detector, which comprises one or two first transistors 331. When the number of the first transistor 331 is two, these two first transistors 331 will be able to form as a differential pair of first transistors. The first transistors 331 are provided with the first terminals connected to a power supply voltage $V_{DD}$, the second terminals with a first current $I_1$, and the control terminals for receiving a single RF input signal or a differential pair of input signals RF_inn and RF_inp via a first capacitor 333 and connected to the power supply unit 31 to receive the power supply signal $S_P$.

The power amplifier unit 35 comprises one or two transistors 351. When the number of the second transistor 351 is two, these two second transistors 351 will be able to form as a differential pair of second transistors. The second transistors 351 are provided with the first terminals connected to the power supply voltage $V_{DD}$, the second terminals connected to ground, and the control terminals for receiving the single RF input signal or the differential pair of input signals RF_inn and RF_inp via a second capacitor 353. The first capacitors 333 and the second capacitors 353 are used for eliminating the DC voltage component of the input signals RF_inn and RF_inp, such that the input power detection unit 33 and the power amplifier unit 35 will only receive the AC voltage component of the input signals RF_inn and RF_inp.

In one embodiment of the present invention, the control terminals of the first transistors 331 are connected to the first terminal and the control terminal of the power supply transistor 311 of the power supply unit 31 via a first load element 334 respectively, the control terminals of the second transistors 351 are connected to the second terminals of the first transistors 331 via a second load element 354, and the first terminals of the second transistors 351 are connected to $V_{DD}$. In some embodiment of the present invention, the transistors 311, 312, 331, 351 are metal oxide semiconductor transistors (MOS), complementary metal oxide semiconductor transistors (CMOS), bipolar transistors (BJT) or field effect transistors (FET). In certain embodiment of the present invention. the transistors 311, 312, 331, 351 are provided with the first terminals be drain or collector terminals, the second terminals be source or emitter terminals, and control terminals be gate or base terminals.

The input power detection unit 33 is used for detecting the power (or called amplitude) of the input signals RF_inn and RF_inp to generate a first detection signal $S_{D1}$ at the second terminals of the first transistors 331. Furthermore, a bias signal $S_B$ generated at the second load elements 354 of the power amplifier unit 35 may be pulled up or down by means of the first detection signal $S_{D1}$, thereafter, the bias signal $S_B$ is transmitted to the control terminals of the second transistors 351 so as to adjust the gain of the power amplifier unit 35.

If the power of the input signals RF_inn and RF_inp be higher, the bias signal $S_B$ is pulled up by the first detection signal $S_{D1}$, thereafter, the power amplifier unit 35 will be driven by the risen bias signal $S_B$ to flow more current and thus increase the gain. If the power of the input signals RF_inn and RF_inp be lower, the bias signal $S_B$ is pulled down by the first detection signal $S_{D1}$, thereafter, the power amplifier unit 35 will be driven by the fallen bias signal $S_B$ to flow less current and thus decrease the gain. Accordingly, the power amplifier unit 35 adopts the dynamic adjustment gain to amplify the input signals RF_inn and RF_inp, so as to output a single RF output single or a differential pair of output signals RF_outn and RF_outp conforming to actual power desirably and reduce the power consumption of the power amplifier circuit 300 effectively.

The transistor 311, 312, 331, 351 are connected to form a translinear loop. Therefore, the first current $I_1$ flowed through the input power detection unit 33 and the output current $I_{OUT}$ flowed through the power amplifier unit 35 will be stable changed according to the input current $I_{in}$ flowed through the power supply unit 31, correspondingly, such as $I_{in}^2=I_1 \times I_{OUT}$. Thus, the bias signal $S_B$ may be avoided changing in the nonlinear due to the factor of process variation, and the stability in the gain adjustment process of the power amplifier unit 35 is increased.

In one embodiment of the present invention, the second terminals of the first transistors 331 are further connected with a capacitor 335. Whereby the capacitor unit 335 further disposed in the translinear loop, the bias signal $S_B$ may be boosted, such that more output current $I_{OUT}$ always flows through the power amplifier unit 35 to enhance the gain of power amplifier unit 35.

Figure 4:
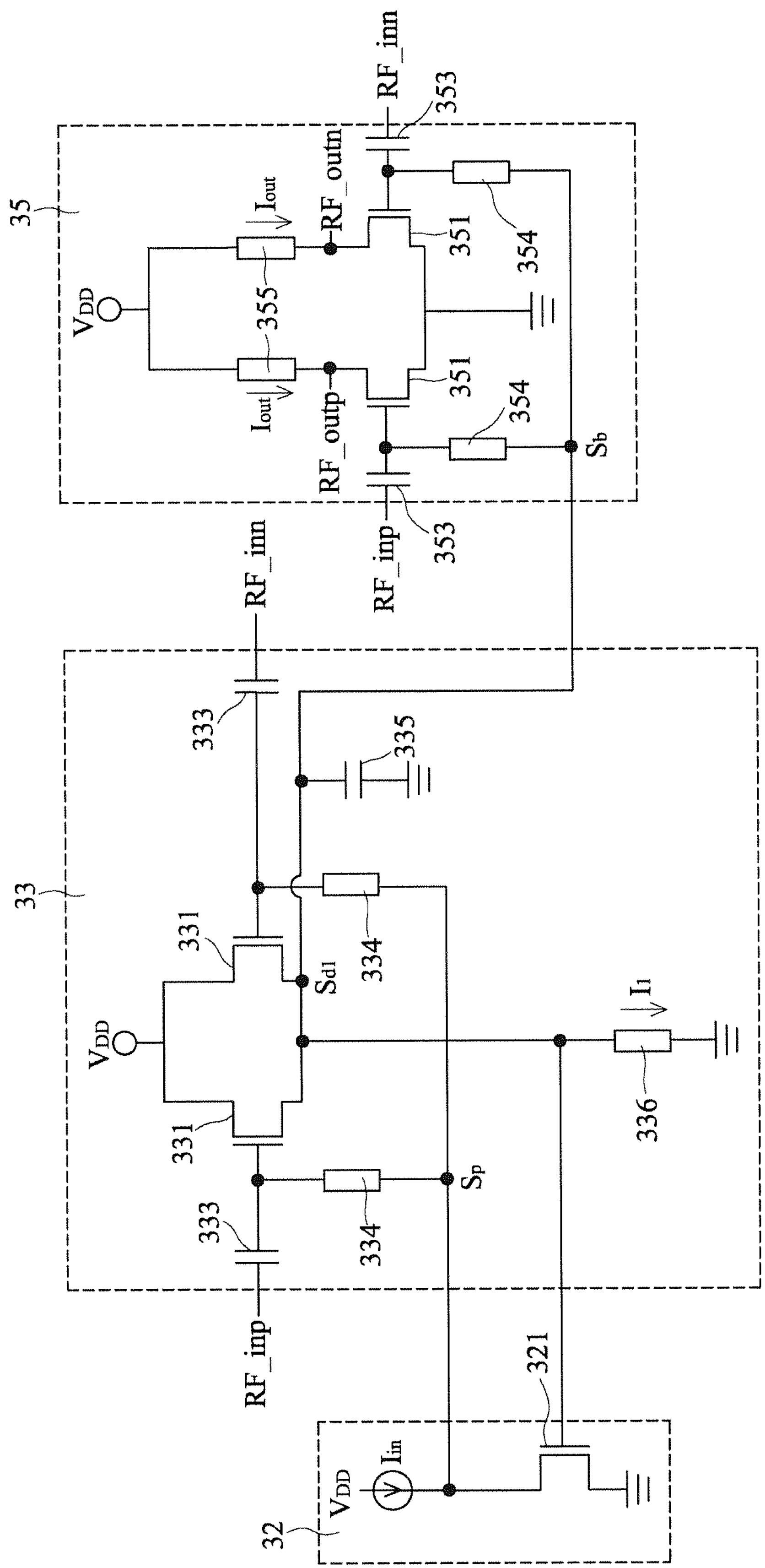
FIG. 4 is a circuit diagram of a power amplifier circuit according to another embodiment of the present invention.

Referring to FIG. 4, there is shown a circuit diagram of a power amplifier circuit according to another embodiment of the present invention. As shown in figure, the power supply unit 32 of the power amplifier circuit 301 in the present embodiment is able to use only single power supply transistor 321 for providing the power supply signal $S_P$.

The power supply transistor 321 is provided with the first terminal connected to the control terminals of the first transistors 331 via the first load element 334, the second terminal connected to ground, and the control terminal connected to the second terminals of the first transistors 331 and connected to ground via a load unit 336.

In present embodiment, the transistors 321, 331, 351 are also connected to form a translinear loop so as to generate the stable bias signal $S_B$ to adjust the gain of the power amplifier unit 35.

Figure 5:
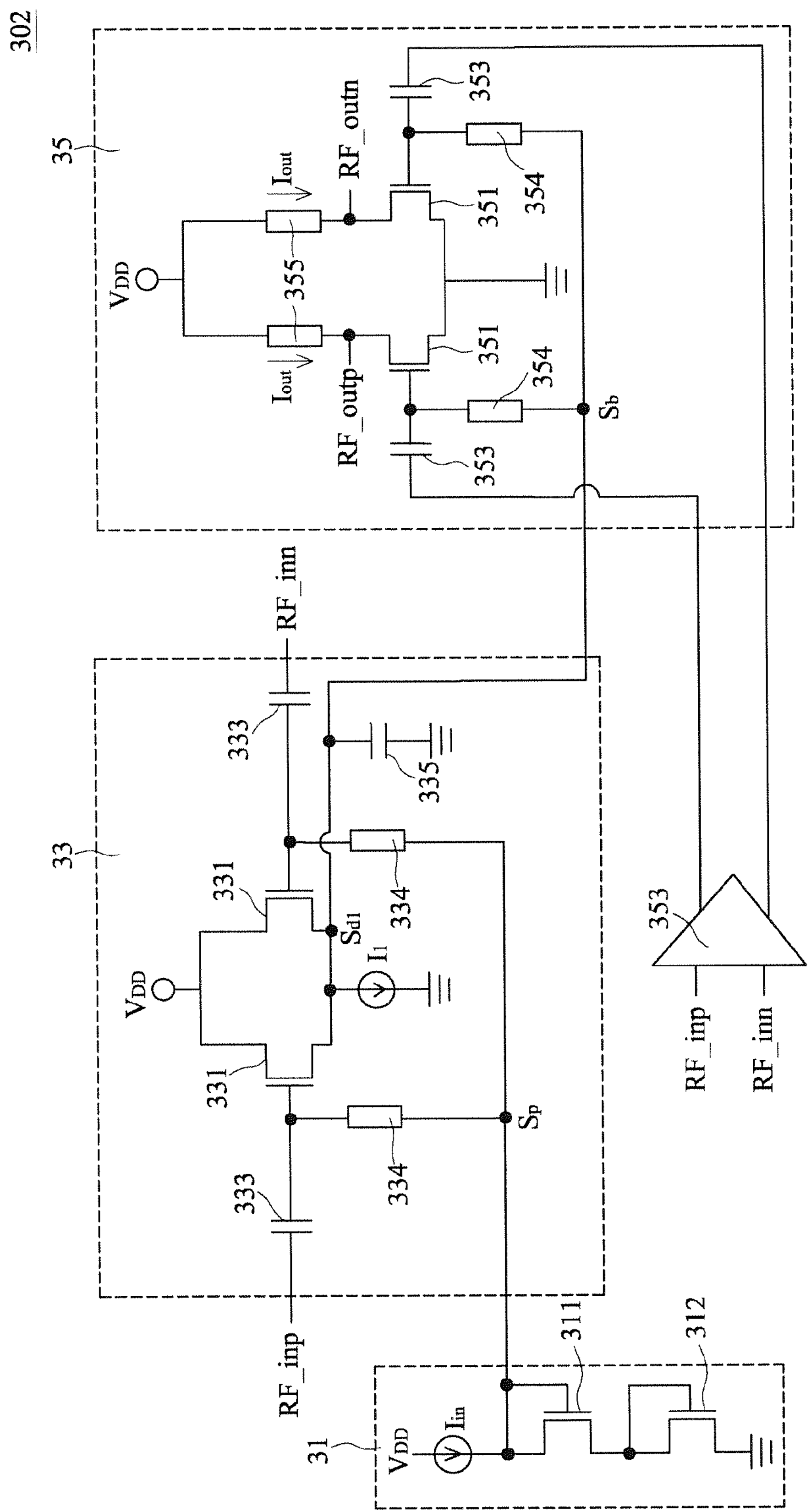
FIG. 5 is a circuit diagram of a power amplifier circuit according to another embodiment of the present invention.

Referring to FIG. 5, there is shown a circuit diagram of a power amplifier circuit according to another embodiment of the present invention. As shown in figure, the power amplifier circuit 302 of the present embodiment further comprises a first delay amplifier 36 that is used for delaying the input signals RF_inn and RF_inp to transmit to the power amplifier 35.

In the present embodiment, the first delay amplifier 36 defines a signal delay transmission time $T_X$ that is greater than or equal to a required operation time $T_D$ in a power detection process executed by the input power detection unit 33, such as $T_X \geq T_D$.

When the circuit 302 is starting operation, the input signals RF_inn and RF_inp will be transmitted to the first delay amplifier 36 and the input power detection unit 33, respectively. The first delay amplifier 36 is used for delaying the input signals RF_inn and RF_inp to transmit to the power amplifier unit 35. The input power detection unit 33 is used for detecting the power of the input signals RF_inn and RF_inp to obtain a first detection signal $S_{D1}$. Thereafter, the detection signal $S_{D1}$ is transmitted to the power amplifier unit 35 so as to pull up or down the bias signal $S_B$ and therefore adjust the gain of the power amplifier unit 35.

When the circuit 302 has operated to time $T_X$, the first delay amplifier 36 will be allowed to output the input signals RF_inn and RF_inp to the power amplifier unit 35. Then, the power amplifier unit 35 amplifies the input signals RF_inn and RF_inp by the using of the adjusted gain.

Accordingly, the gain of the power amplifier circuit 35 is before adjusting, the input signals RF_inn and RF_inp will be deferrable transmitted to the power amplifier unit 35 by means of the first delay amplifier 36, so as to avoid the power amplifier circuit adopting the unadjusted gain to amplify the input signals RF_inn and RF_inp.

Figure 6:
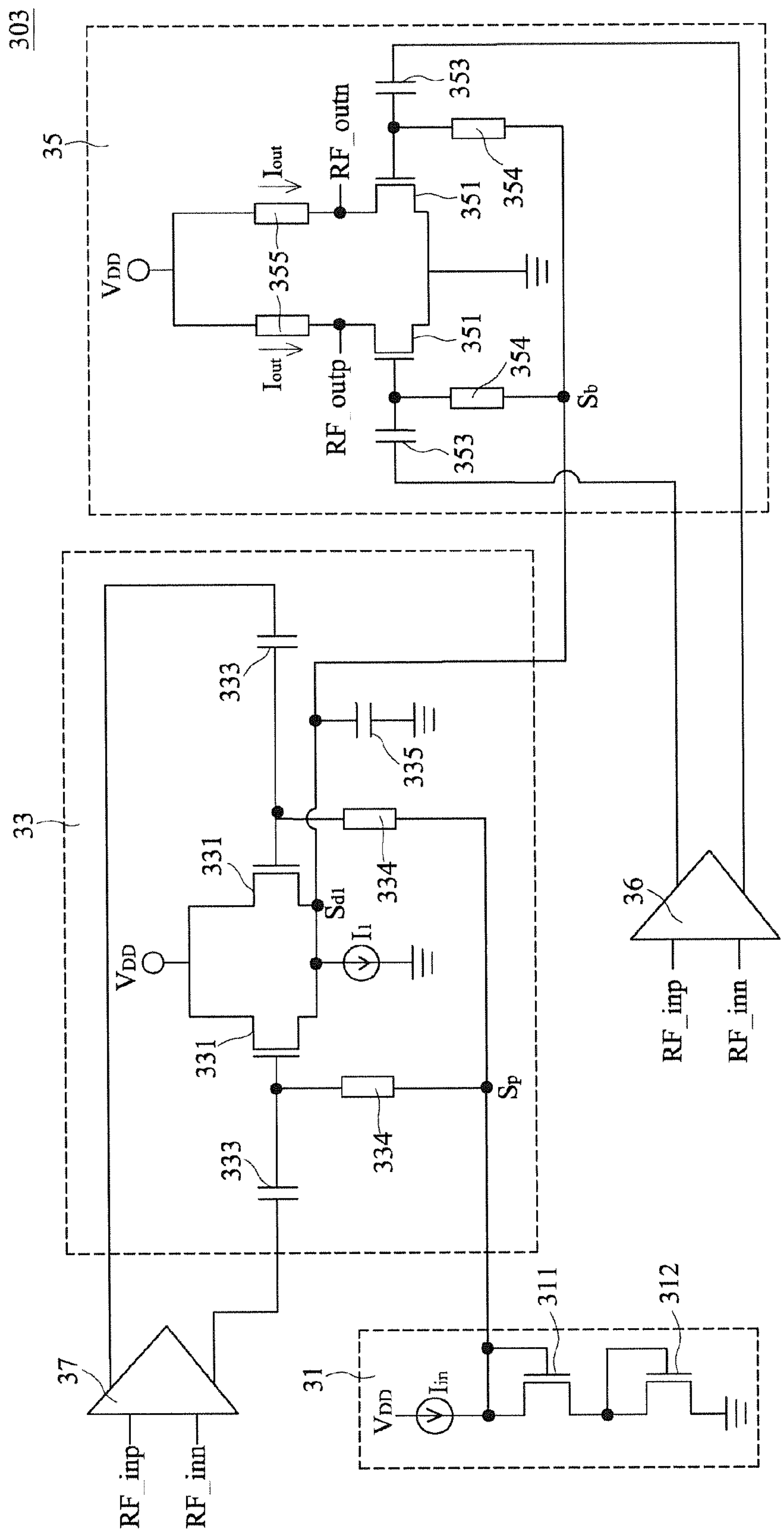
FIG. 6 is a circuit diagram of a power amplifier circuit according to another embodiment of the present invention.

Referring to FIG. 6, there is shown a circuit diagram of a power amplifier circuit according to another embodiment of the present invention. As shown in figure, the power amplifier circuit 303 of the present embodiment further comprises a second delay amplifier 37 that is used for delaying the input signals RF_inn and RF_inp to transmit to the input power detection unit 33.

In the present embodiment, the first delay amplifier 36 defines a signal delay transmission time $T_X$ and the second delay amplifier 37 defines another signal delay transmission time $T_X$. The signal delay transmission time $T_X$ defined by the first delay amplifier 36 is greater than or equal to the sum of the signal delay transmission time $T_Y$ defined by the second delay amplifier 37 and the required operation time $T_D$ in the power detection process executed by the input power detection unit 33, such as $T_X \geq T_Y + T_D$.

When the circuit 303 is starting operation, the input signals RF_inn and RF_inp will be transmitted to the first delay amplifier 36 and the second delay amplifier 37, respectively. The first delay amplifier 36 is used for delaying the input signals RF_inn and RF_inp to transmit to the power amplifier unit 35, while the second delay amplifier 37 is used for delaying the input signals RF_inn and RF_inp to transmit to the input power detection unit 33. When the circuit 303 has operated to time $T_Y$, the second delay amplifier 37 will be allowed to output the input signals RF_inn and RF_inp to the input power detection unit 33.

Continuously, at the power detection operation time $T_D$ later, the input power detection unit 33 has completed the detection for the power of the input signals RF_inn and RF_inp, in which is able to obtain the first detection signal $S_{D1}$. Thereafter, the first detection signal $S_{D1}$ is transmitted to the power amplifier unit 35 so as to pull up or down the bias signal $S_B$ and therefore adjust the gain of the power amplifier unit 35.

Subsequently, when the circuit 303 has operated to time $T_X$, the first delay amplifier 36 will be allowed to output the input signals RF_inn and RF_inp to the power amplifier unit 35. Then, the power amplifier unit 35 amplifies the input signals RF_inn and RF_inp by the using of the adjusted gain.

Accordingly, whereby the disposition of the first delay amplifier 36 and the second delay amplifier 37, it can avoid the power amplifier unit 35 adopting the unadjusted gain to amplify the input signals RF_inn and RF_inp, and ensure the input signal RF_inn and the input signal RF_inp being inputted to the input power detection unit 33 or the power amplifier unit 35 synchronously so as to avoid the error happened during the operation of circuit.

In one embodiment of the present invention, the power amplifier circuit 302 or 303 may be selecting one of the power supply unit 31 and 32 for providing the power supply signal $S_P$.

Figure 7:
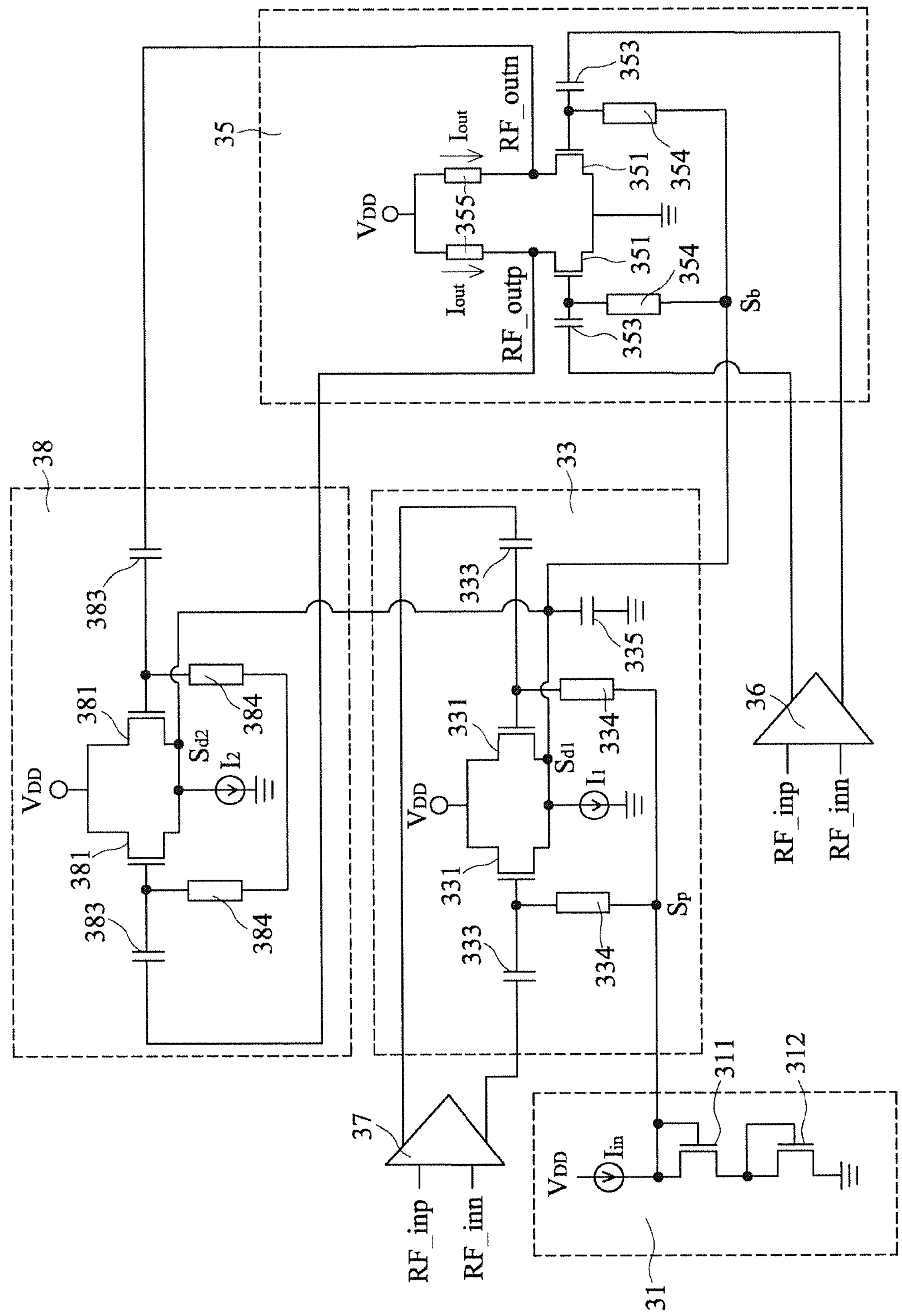
FIG. 7 is a circuit diagram of a power amplifier circuit according to another embodiment of the present invention.

Referring to FIG. 7, there is shown a circuit diagram of a power amplifier circuit according to another embodiment of the present invention. As shown in figure, the power amplifier circuit 304 of the present embodiment further comprises an output power detection unit 38. The output power detection unit 38 comprises one or two third transistors 381. When the number of the third transistor 381 is two, these two third transistors 381 will be able to form as a differential pair of third transistors. The third transistors 381 are provided with the first terminals connected to the power supply voltage $V_{DD}$, the second terminals with a second current $I_2$ and connected to the second terminals of the first transistors 331, and the control terminals connected to the first terminals of the second transistors 351 via a third capacitor 383 to receive the single RF output signal or the differential pair of output signals RF_outn and RF_outp. The output power detection unit 38 is used for detecting the power of the output signals RF_outn and RF_outp to generate a second detection signal $S_{D2}$ at the second terminals of the third transistors 381.

Furthermore, the control terminals of third transistors 381 are connected together via a fourth load element 384. In each embodiment of the present invention, the first load elements 334, the second load elements 354, the third load elements 355 or the fourth load elements 384 are resistor or inductor.

Figure 8:
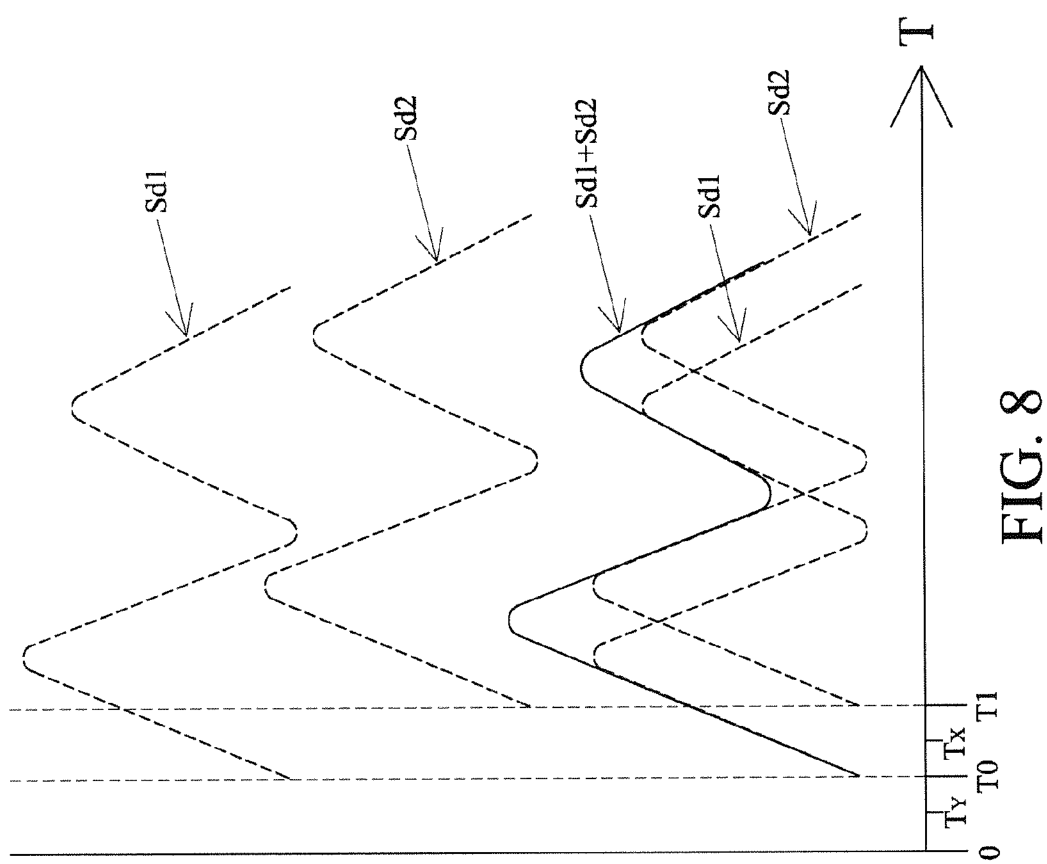
FIG. 8 is a waveform diagram of the first detection signal, the second detection signal, and the synthesis signal of the first detection signal and the second detection signal in power amplifier circuit of embodiment in FIG. 7.

Further, referring to FIG. 8 together, when the circuit 304 is starting operation, the input signals RF_inn and RF_inp will be transmitted to the first delay amplifier 36 and the second delay amplifier 37, respectively. When the circuit 304 is operated at time $T_Y$, the input power detection unit 33 will be able to receive the input signals RF_inn and RF_inp outputted from the second delay amplifier 37.

When the circuit 304 is operated at time $T_0$, the input power detection unit 33 will be allowable to detect the power of the input signals RF_inn and RF_inp to generate the first detection signal $S_{D1}$. Then, the first detection signal $S_{D1}$ is transmitted to the power amplifier unit 35, so as to pull up or down the bias signal $S_B$ and therefore adjust the gain of the power amplifier unit 35.

When the circuit 304 is operated at time $T_X$, the first delay amplifier 36 will be allowed to output the input signals RF_inn and RF_inp to the power amplifier unit 35. Then, the power amplifier unit 35 adopting the gain adjusted by the first detection signal $S_{D1}$ amplifies the input signals RF_inn and RF_inp to generate the output signals RF_outn and RF_outp.

When the circuit 304 is operated at time $T_1$, the output power detection unit 38 will be allowable to detect the power of the output signals RF_outn and RF_outp to generate the second detection signal $S_{D2}$. Afterwards, the first detection signal $S_{D1}$ and the second detection signal $S_{D2}$ are transmitted to the power amplifier unit 35 together so as to further pull up or down the bias signal $S_B$ and therefore adjust the gain of the power amplifier unit 35. The operation of the circuit 304 is continuously performing until all of the input signals RF_inn and RF_inp are amplified and outputted.

In the case, the bias of the power amplifier unit 35 is adjusted by two detection signals $S_{D1}$, $S_{D2}$ generated at different time, in such a way that the power amplifier unit 35 can always obtain the sufficient output current $I_{OUT}$ so as to maintain the gain to be in the high-level.

Besides, the bias of the power amplifier unit 35 is adjusted by a detection signal $S_{D1}$ obtained in the earlier time and another detection signal $S_{D2}$ obtained in the later time together, in which is able to prolong the operation time of amplification process of the power amplifier unit 35. As a result, even if the input signals RF_inn and RF_inp are inputted to the power amplifier unit 35 ahead of time or behind time due to the factor of process variation, the input time of the input signals RF_inn and RF_inp will always be included in the range of the prolonged operation time of amplification process of the power amplifier unit 35, such that the power amplifier unit 35 can be successfully amplifying the input signals RF_inn and RF_inp inputted ahead of time or behind time.

Naturally, there are still various embodiments for the present invention. It should be understood that various changes and alterations could be made to the present invention by those skilled in the art without departing from the spirit and scope of the invention, and included within the scope of the appended claims.

The invention claimed is:

1. A power amplifier circuit, comprising:

a power supply unit, used for providing a power supply signal;

an input power detection unit, comprising at least one first transistor that is having the first terminal connected to a power supply voltage, the second terminal with a first current, and the control terminal for receiving at least one input signal via a first capacitor and connected to said power supply unit, wherein said input power detection unit is used for detecting the power of said at least one input signal to generate a first detection signal at the second terminal of said at least one first transistor, in which a bias signal is pulled up or down by means of said detection signal; and a power amplifier unit, comprising at least one second transistor that is having the first terminal connected to said power supply voltage and for outputting at least one output signal, the second terminal connected to ground, and the control terminal for receiving said at least one input signal via a second capacitor, wherein said bias signal is transmitted to the control terminal of said at least one second transistor so as to adjust the gain of said power amplifier unit.

2. The power amplifier circuit according to claim 1, wherein the second terminal of said at least one first transistor is further connected with a capacitor unit.

3. The power amplifier circuit according to claim 1, wherein the control terminal of said at least one first transistor is connected to said power supply unit via a first load element that be resistor or inductor.

4. The power amplifier circuit according to claim 3, wherein said power supply unit comprises at least two power supply transistors connected in the form of diode and coupled in a cascade configuration, the first terminal and the second terminal of said power supply transistor cascaded in the uppermost position is connected to the control terminal of said at least one first transistor via said first load element.

5. The power amplifier circuit according to claim 3, wherein said power supply unit comprises a power supply transistor that is having the first terminal connected to the control terminal of said at least one first transistor via said first load element, the second terminal connected to ground, and the control terminal connected to the second terminal of said at least one first transistor and connected to ground via a load unit.

6. The power amplifier circuit according to claim 1, wherein the control terminal of said at least one second transistor is connected to the second terminal of said at least one second transistor via a second load element that be resistor or inductor.

7. The power amplifier circuit according to claim 1, wherein the first terminal of said at least one second transistor is connected to said power supply voltage via a third load element that be resistor or inductor.

8. The power amplifier circuit according to claim 1, wherein the number of said first transistor is two, said two first transistors will be able to form as a differential pair of first transistors, the number of said second transistor is two, said two second transistors will be able to form as a differential pair of second transistors; wherein the control terminals of said differential pair of first transistors and said differential pair of second transistors are for receiving two said input signals that are a differential pair of input signals, while the first terminals of said differential pair of second transistors are for outputting two said output signals that are a differential pair of input signals.

9. The power amplifier circuit according to claim 1, further comprising a first delay amplifier, wherein said power amplifier unit receives said at least one input signal via said first delay amplifier, said first delay amplifier defines a signal delay transmission time that is greater than or equal to a required operation time in a power detection process executed by said input power detection unit, wherein said at least one input signal will be transmitted to said input power detection unit and said first delay amplifier, respectively; thereafter, said first delay amplifier will be allowed to transmit said at least one input signal to said power amplifier unit after waiting said signal delay transmission time.

10. The power amplifier circuit according to claim 1, further comprising a first delay amplifier and a second delay amplifier, wherein said power amplifier unit receives said at least one input signal via said first delay amplifier and said input power detection unit receives said at least one input signal via said second delay amplifier, said first delay amplifier defines a signal delay transmission time and said second delay amplifier defines another signal delay transmission time, said signal delay transmission time defined by said first delay amplifier is greater than or equal to the sum of said another signal delay transmission time defined by said second delay amplifier and a required operation time in a power detection process executed by said input power detection unit, wherein said at least one input signal will be transmitted to said first delay amplifier and said second delay amplifier, respectively; thereafter, said second delay amplifier will be allowed to transmit said at least one input signal to said input power detection unit after waiting said another signal delay transmission time defined by said second delay amplifier, while said first delay amplifier will be allowed to transmit said at least one input signal to said power amplifier unit after waiting said signal delay transmission time defined by said first delay amplifier.

11. The power amplifier circuit according to claim 1, further comprising an output power detection unit, said output power detection unit comprises at least one third transistor that is having the first terminal connected to said power supply voltage, the second terminal with a second current and connected to the second terminal of said at least one first transistor, and the control terminal connected to the first terminal of said at least one second transistor via a third capacitor to receive said at least one output signal, wherein said output power detection unit is used for detecting the power of said at least one output signal to generate a second detection signal at the second terminal of said at least one third transistor, in such a way that said bias signal may be pull up or down by means of said first detection signal and said second detection signal together.

12. The power amplifier circuit according to claim 11, wherein the number of said first transistor is two, said two first transistors will form as a differential pair of first transistors, the number of said second transistor is two, said two second transistors will form as a differential pair of second transistors, the number of said third transistor is two, said two third transistors form as a differential pair of third transistors; wherein the control terminals of said differential pair of first transistors and said differential pair of second transistors are for receiving two said input signals that are a differential pair of input signals, the first terminals of said differential pair of second transistors are for outputting two said output signals that are a differential pair of input signals, while the control terminals of said differential pair of third transistors are for receiving said differential pair of output signals.

13. The power amplifier circuit according to claim 12, wherein the control terminals of said differential pair of third transistors are connected together via a fourth load element that be resistor or inductor.

* * * * *